United States Patent [19]

Pollard et al.

[11] Patent Number: 4,504,850
[45] Date of Patent: Mar. 12, 1985

[54] DISC-TYPE SEMICONDUCTOR MOUNTING ARRANGEMENT WITH FORCE DISTRIBUTION SPACER

[75] Inventors: David D. Pollard, Amanda Township, Allen County; Ting-Long Ho, Shawnee Township, Allen County, both of Ohio

[73] Assignee: Westinghouse Electric Corp., Pittsburgh, Pa.

[21] Appl. No.: 308,320

[22] Filed: Oct. 2, 1981

[51] Int. Cl.³ .................... H01L 23/42; H01L 23/16; H01L 23/02; H01L 23/44
[52] U.S. Cl. .................................. 357/79; 357/75; 357/81
[58] Field of Search ............... 357/79, 75, 81; 403/76, 403/78; 269/203, 249

[56] References Cited

U.S. PATENT DOCUMENTS

| 2,368,843 | 2/1945 | Kees | 403/76 |
| 2,486,482 | 11/1949 | La Brie | 357/79 |
| 3,448,957 | 6/1969 | Friedman | 403/76 |
| 3,704,014 | 11/1972 | Keene | 269/249 |
| 3,723,836 | 3/1973 | Shekerjian et al. | 357/79 |
| 3,808,471 | 4/1974 | Grandia | 357/79 |

FOREIGN PATENT DOCUMENTS 2603813 8/1977 Fed. Rep. of Germany ........ 357/79

Primary Examiner—Martin H. Edlow
Assistant Examiner—J. Jackson
Attorney, Agent, or Firm—R. P. Lenart

[57] ABSTRACT

A disc-type semiconductor mounting arrangement is provided with force distribution spacers. One side of each spacer contains a counterbore which prevents contact between the center of the spacer and other elements of a stack of semiconductors and associated heat sinks and bus bars. Compressive force applied to the assembly is thereby distributed across the semiconductor pole area.

6 Claims, 4 Drawing Figures

DISC-TYPE SEMICONDUCTOR MOUNTING ARRANGEMENT WITH FORCE DISTRIBUTION SPACER

BACKGROUND AND SUMMARY OF THE INVENTION

This invention relates to assemblies of semiconductor devices and more particularly to assemblies of disc-mounted semiconductor devices with provisions for the distribution of compressive forces on the semiconductor pole faces.

Disc mount semiconductor devices are those in which a semiconductor device is encapsulated in a package having opposing circular faces to which pressure contact is made, without bonding, for electrical continuity to regions of the enclosed device as well as for heat transfer. Such packaged devices are well known and widely used and may include either diodes, transistors, or thyristors, in accordance with known practice. The term "hockey puck" is often used in referring to devices encapsulated in this manner because of similarities of appearance. Such devices are also sometimes referred to as compression bonded encapsulated (CBE) devices.

The nature of disc mount devices is such that it is necessary to apply a predetermined force, typically in a range from about 1000 to about 2000 pounds, that is accurately positioned along the central axis of the device. The compressive force is necessary to ensure good conduction of current and heat through the various interfaces within the semiconductor and at the semiconductor pole faces. Uneven forces may cause hot spots or mechanical damage by localized overstressing of the semiconductor parts. The hot spot or overstress will cause premature failure of the semiconductor.

For many years, heat sink vendors have been offering clamps specifically designed for compressing hockey puck semiconductors. Many of the clamps provide a gimbal or swivel to center the compression force. Others provide a deformation in the clamp spring to provide centering of the force. None of the systems offered for sale by these vendors make provisions of uniform distribution of the clamping force over the pole face of the hockey puck semiconductor.

In use, one or more of the semiconductor devices, frequently several, are stacked with intermediate sheet metal elements that serve as heat sinks and electrical conductors. Prior art disc-type semiconductor mounting arrangements employ a clamp which places a compressive force along the central axis of the stack of semiconductors and sheet metal elements. If the sheet metal element which is in contact with one of the semiconductor pole faces is very thick, it will tend to distribute the compressive force from the swivel or gimbal or deformed spring, but the forces will still be higher in the center than near the periphery of the semiconductor pole face. If the heat sink or bus bar is thin, the forces will be highly concentrated near the center.

The present invention comprises a stack of components including one or more disc-mounted semiconductors and one or more force distributing spacers, arranged in line along a common axis, and means for applying compressive force along the axis, such as a clamp. Each force distributing spacer is counterbored on the side which is closest to the semiconductors to cause an outward distribution of the applied force. The opposite side of the spacer may have a swivel, ball, gimbal, convex surface, or other means to ensure that the applied force is at the center of the spacer. The thickness of the spacer need only be adequate to transfer the force without deformation which would allow contact at the center within the counterbore.

This arrangement results in a force distribution on the semiconductor side of the spacer in the form of a narrow band ring around the perimeter of the counterbore. The insertion of a metal heat sink or bus bar between the spacer and semiconductor increases the width of the force band at the semiconductor pole surface, thereby effectively averaging the force in the pole face area.

DESCRIPTION OF THE PREFERRED EMBODIMENTS

Figure 1:
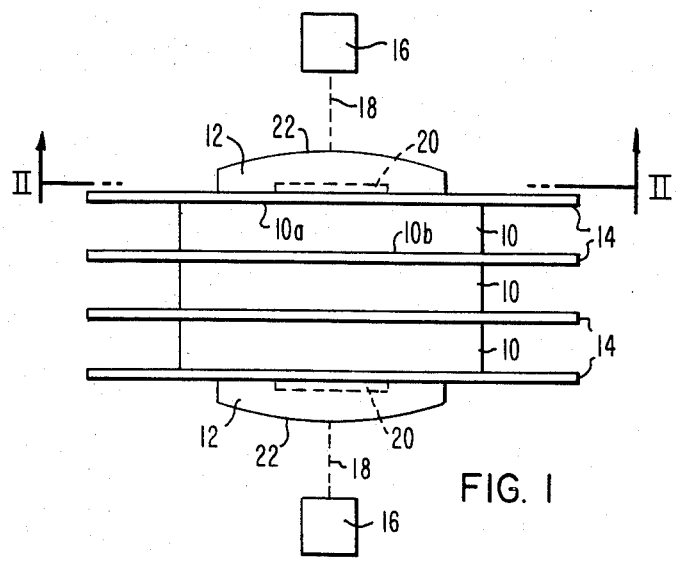
FIG. 1 is a partial elevation view of a semiconductor device assembly in accordance with one embodiment of the invention.

Referring to the drawings, FIG. 1 shows a stack of disc-mounted, compression-bonded encapsulated semiconductor devices 10 and heat sink/electrical bus bar elements 14 assembled between force distributing spacers 12. The assembly may include several devices 10, although only three are shown to illustrate the principles of the invention. Each of the semiconductor devices 10 is a diode, transistor, thyristor, or the like packaged in accordance with known techniques to provide opposing contact faces 10a and 10b to which pressure contact is made for electrical continuity and heat transfer between the internal semiconductor elements and the adjacent heat sink/electrical bus bar 14. The semiconductor devices 10 each have a circular configuration and are aligned along a common axis with spacers 12.

Each of the heat sink/electrical bus bar elements 14 is a metal sheet that communicates with additional portions of an electrical circuit in which the semiconductor devices 10 are connected.

The stack is held together and the devices 10, heat sink/electrical bus bar elements 14, and spacers 12 are held in pressure contact with each other by a force supplying means 16 that is centrally located to maintain a force on the central axis of the devices 10 directed along line 18. Prior means, such as those employing leaf springs and clamping bolts are suitable for applying the prescribed amount of pressure, such as a force of about 1000 to 2000 pounds, to the stack.

In accordance with the present invention, spacers 12 are provided with a central recess or counterbore 20 which is centered along the common axis shown by line 18. The counterbore diameter will vary with the diameter of the semiconductor device contact faces 10a and 10b. The depth of the counterbore will be adequate to preclude contact of the spacer 12 with the adjacent heat sink/electrical bus bar 14 at the center of the spacer.

The opposite side of each spacer 12 has a convex surface 22 which serves as a means for ensuring that the applied force is at the center of the spacer. It should be apparent that other known devices such as a swivel, ball, or gimbal could be used in place of the convex surface on the spacers 12 to ensure that the applied force is at the center of the spacer.

The force applied by force supplying means 16 is therefore distributed on the hockey puck side of spacers 12 in the form of a narrow band ring around the perimeter of counterbore 20. The width of this band is increased as the force is transmitted through each heat sink/electrical bus bar 14 and the contact faces of each semiconductor device 10a and 10b. This effectively averages the force in the semiconductor device pole area.

A semiconductor assembly in accordance with the present invention has been constructed utilizing disc-type semiconductors with a pole face diameter of 1.156 inches. Both steel and aluminum 6061-T6 spacers have been used wherein the spacers were 0.125 inches thick and had a diameter of 0.80 inches. The counterbore diameter was 0.50 inches and its depth was 0.004 to 0.008 inches. The opposite side of the spacer included a 2° radial angle cut from the center to the perimeter and a 0.125 inch locating pin hole was provided in the center of the spacer to insure axial alignment in the assembly. An aluminum heat sink/electrical bus bar 0.0625 inches thick was located between the spacer and the semiconductor.

Figure 2:
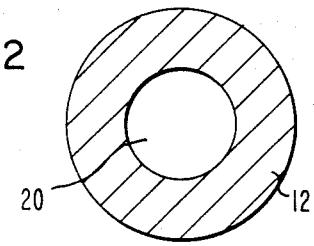
FIG. 2 is a plan view of the spacer, taken along line II—II of FIG. 1.

FIG. 2 is a plan view of spacer 12 showing counterbore 20. It should be apparent that counterbore 20 can take forms which differ from that shown in the drawings as long as contact between the center of spacer 12 and heat sink/electrical bus bar 14 is avoided when pressure is appled to the assembly. The thickness of spacer 12 need only be adequate to transfer the applied force without deformation which would allow contact of a heat sink/electrical bus bar with the center of spacer 12 within counterbore 20.

Figure 3:
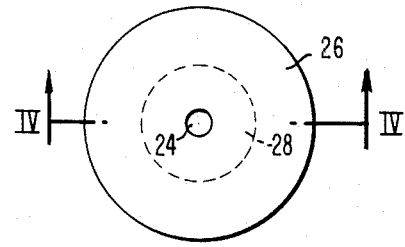
FIG. 3 is a plan view of an alternate embodiment of the spacer of FIG. 2.

FIG. 3 is a plan view of an alternate embodiment of a spacer 26 showing the addition of hole 24 which can accommodate a locating pin (not shown). This would facilitate joining of the parts in the assembly.

Figure 4:
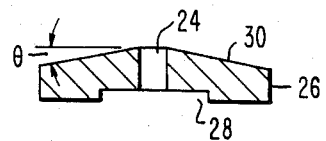
FIG. 4 is a sectional view of the spacer of FIG. 3, taken along line IV—IV.

FIG. 4 is a sectional view of the spacer of FIG. 3 which is taken along line IV—IV, and shows an embodiment of the means for ensuring that the applied force is at the center of the spacer. Convex surface 30 has been formed by cutting one side of spacer 26 at a radial angle $\theta$. Counterbore 28 corresponds to counterbore 20 in FIG. 1.

It is therefore seen that the present invention provides an assembly for holding disc-mounted semiconductor devices in a stack associated with pressure applying equipment so that the applied pressure is distributed over the semiconductor contact faces to minimize the possibility of hot spots or mechanical damage caused by localized overstressing of the semiconductor parts.

What is claimed is:

1. A semiconductor device mounting arrangement comprising:
   a disc-type semiconductor device having opposing contact faces;
   a metal sheet for making electrical and thermal contact with one of said contact faces of said device;
   a spacer having a counterbore in one side, said counterbored side being disposed in contact with said metal sheet on the opposite side of said metal sheet as said device;
   means for applying a predetermined pressure to force said device, said metal sheet, and said spacer into intimate contact, with said counterbore having sufficient depth to preclude contact between the center of said counterbore and said metal sheet, when said predetermined pressure is applied, and wherein the forces on the spacer side of said metal sheet are effectively averaged on the device side of said metal sheet; and
   means for centering said predetermined pressure on a second side of said spacer.

2. A semiconductor device mounting arrangement as recited in claim 1, wherein said means for centering said predetermined pressure is a convex surface on a second side of said spacer, opposite to said counterbored side.

3. A semiconductor device mounting arrangement comprising:
   a disc-type semiconductor device having opposing contact faces;
   a metal sheet for making electrical and thermal contact with each of said contact faces of said devices;
   two spacers each having a counterbore in one side, said counterbored sides being disposed in contact with said metal sheets on the opposite side of said metal sheets as said device;
   means for applying a predetermined pressure to force said device, said metal sheets, and said spacers into intimate contact, with each of said counterbores having sufficient depth to preclude contact between the center of each counterbore and the adjacent metal sheet, when said predetermined pressure is applied, and wherein the forces on the spacer side of each of said metal sheets are effectively averaged on the device side of each of said metal sheets; and
   means for centering said predetermined pressure on a second side of each of said spacers.

4. A semiconductor device mounting arrangement as recited in claim 3, wherein said means for centering said predetermined pressure is a convex surface on a second side of each of said spacers, opposite to said counterbored side.

5. A semiconductor device mounting arrangement comprising:
   a plurality of disc-type semiconductors, each having opposing contact faces;
   a plurality of metal sheets for making electrical and thermal contact with each of said contact faces;
   a plurality of spacers, each having a counterbore in one side, said counterbored sides being disposed in contact with said metal sheets on the opposite side of said metal sheets as said contact faces;
   means for applying a predetermined pressure to force said device, said metal sheets, and said spacers into intimate contact, with each of said counterbores having sufficient depth to preclude contact between the center of each counterbore and the adjacent metal sheet, when said predetermined pressure is applied, and wherein the forces on the spacer side of each of said metal sheets are effectively averaged on the device side of each of said metal sheets; and
   means for centering said predetermined pressure on a second side of each of said spacers.

6. A semiconductor device mounting arrangement as recited in claim 5, wherein said means for centering said predetermined pressure is a convex surface on a second side of each of said spacers, opposite to said counterbored side.

* * * * *